(12) United States Patent
McKinnon et al.

(10) Patent No.: US 10,129,644 B2
(45) Date of Patent: Nov. 13, 2018

(54) SYSTEMS AND METHODS FOR ADAPTIVE ZONE CONTROL OF A LARGE SCALE AUDIO SYSTEM

(71) Applicant: LOUD Audio, LLC, Woodinville, WA (US)

(72) Inventors: Geoffrey Peter McKinnon, Woonsocket, RI (US); Nathan Butler, Sterling, MA (US); Adam David Maxwell Shulman, Watertown, MA (US)

(73) Assignee: LOUD AUDIO, LLC, Woodinville, WA (US)

( * ) Notice: Subject to any disclaimer, the term of this patent is extended or adjusted under 35 U.S.C. 154(b) by 0 days.

(21) Appl. No.: 15/884,066

(22) Filed: Jan. 30, 2018

(65) Prior Publication Data

US 2018/0220235 A1 Aug. 2, 2018

Related U.S. Application Data

(60) Provisional application No. 62/452,250, filed on Jan. 30, 2017.

(51) Int. Cl.
*H04R 3/12* (2006.01)
*H04R 1/40* (2006.01)
*H03G 5/16* (2006.01)
*H04R 27/00* (2006.01)
*H04R 29/00* (2006.01)
*H04R 3/04* (2006.01)

(52) U.S. Cl.
CPC .............. *H04R 3/12* (2013.01); *H03G 5/165* (2013.01); *H04R 1/403* (2013.01); *H04R 3/04* (2013.01); *H04R 27/00* (2013.01); *H04R 29/002* (2013.01)

(58) Field of Classification Search
CPC .......... H03G 5/165; H04R 1/403; H04R 3/04; H04R 27/00; H04R 29/002; H04R 29/007
See application file for complete search history.

(56) References Cited

U.S. PATENT DOCUMENTS

2015/0289050 A1   10/2015   Butler et al.

OTHER PUBLICATIONS

EAW, "Spatial Equalization—A Better Way to Tune Sound Systems," May 11, 2017, 7 pages.
EAW Software News, "EAW Resolution v2.4.0.87 Release Notes," Aug. 2017, 24 pages.
Notice of Allowance dated Nov. 28, 2017, issued in commonly owned U.S. Appl. No. 14/683,009, filed Apr. 9, 2015, 8 pages.

*Primary Examiner* — Mark Fischer
(74) *Attorney, Agent, or Firm* — Tutunjian & Bitetto, P.C.

(57) ABSTRACT

Adaptive performance software, operating on a computing device, may be used to control an adaptive loudspeaker system within a venue. In some embodiments, the adaptive performance software may receive a selection of a target area within the venue. The adaptive performance software may then determine a smallest affected zone that includes the target area, and may present the smallest affected zone to the user to indicate what the affected area for the requested changes would be. In some embodiments, the adaptive performance software may take the shape of the venue, the capabilities of the loudspeaker array as configured and flown in the venue, and/or the specific setting changes which are desired in order to determine the smallest affected zone that includes the selected area.

20 Claims, 7 Drawing Sheets

SYSTEMS AND METHODS FOR ADAPTIVE ZONE CONTROL OF A LARGE SCALE AUDIO SYSTEM

CROSS-REFERENCE(S) TO RELATED APPLICATION(S)

This application claims the benefit of Provisional Application No. 62/452,250, filed Jan. 30, 2017, the entire disclosure of which is hereby incorporated by reference herein for all purposes.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In some embodiments, an adaptive loudspeaker system is provided. The system comprises a plurality of adaptive loudspeakers, an electronic network, a control system, and a computing device. The plurality of adaptive loudspeakers comprises a housing; a plurality of transducers within the housing, said transducers being powered and controlled independently of each other; and a digital signal processor channel for each transducer to control the vertical and/or horizontal directionality of the loudspeaker system output. The electronic network interconnects the digital signal processing channels with each other. The control system monitors and controls the operation and performance of the transducers individually, said control system comprising a computer processor connected to said electronic network and capable of receiving acoustic parameters, said control system controlling the operation of the transducers based in part on the received acoustic parameters. The computing device is configured to provide adaptive performance software. The adaptive performance software is configured to calculate an initial set of acoustic parameters for a venue; transmit the initial set of acoustic parameters to the control system; receive a selection of an area of the venue; determine a smallest affected zone that includes the selected area; receive a set of equalization targets; determine a set of modified acoustic parameters in order to implement the set of equalization targets within the smallest affected zone; and transmit the set of modified acoustic parameters to the control system.

In some embodiments, a method of adjusting an adaptive loudspeaker system in a venue is provided. A computing device calculates an initial set of acoustic parameters. The computing device transmits the initial set of acoustic parameters to a control system of the adaptive loudspeaker system. The computing device receives a selection of an area of the venue. The computing device determines a smallest affected zone that includes the selected area. The computing device receives a set of equalization targets. The computing device determines a set of modified acoustic parameters in order to implement the set of equalization targets within the smallest affected zone. The computing device transmits the set of modified acoustic parameters to the control system of the adaptive loudspeaker system to implement the equalization targets in the smallest affected zone.

In some embodiments, a non-transitory computer-readable medium is provided. The computer-readable medium has computer-executable instructions stored thereon that, in response to execution by one or more processors of a computing device, cause the computing device to adjust an adaptive loudspeaker system in a venue by calculating an initial set of acoustic parameters; transmitting the initial set of acoustic parameters to a control system of the adaptive loudspeaker system; receiving a selection of an area of the venue; determining a smallest affected zone that includes the selected area; receiving a set of equalization targets; determining a set of modified acoustic parameters in order to implement the set of equalization targets within the smallest affected zone; and transmitting the set of modified acoustic parameters to the control system to implement the equalization targets in the smallest affected zone.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
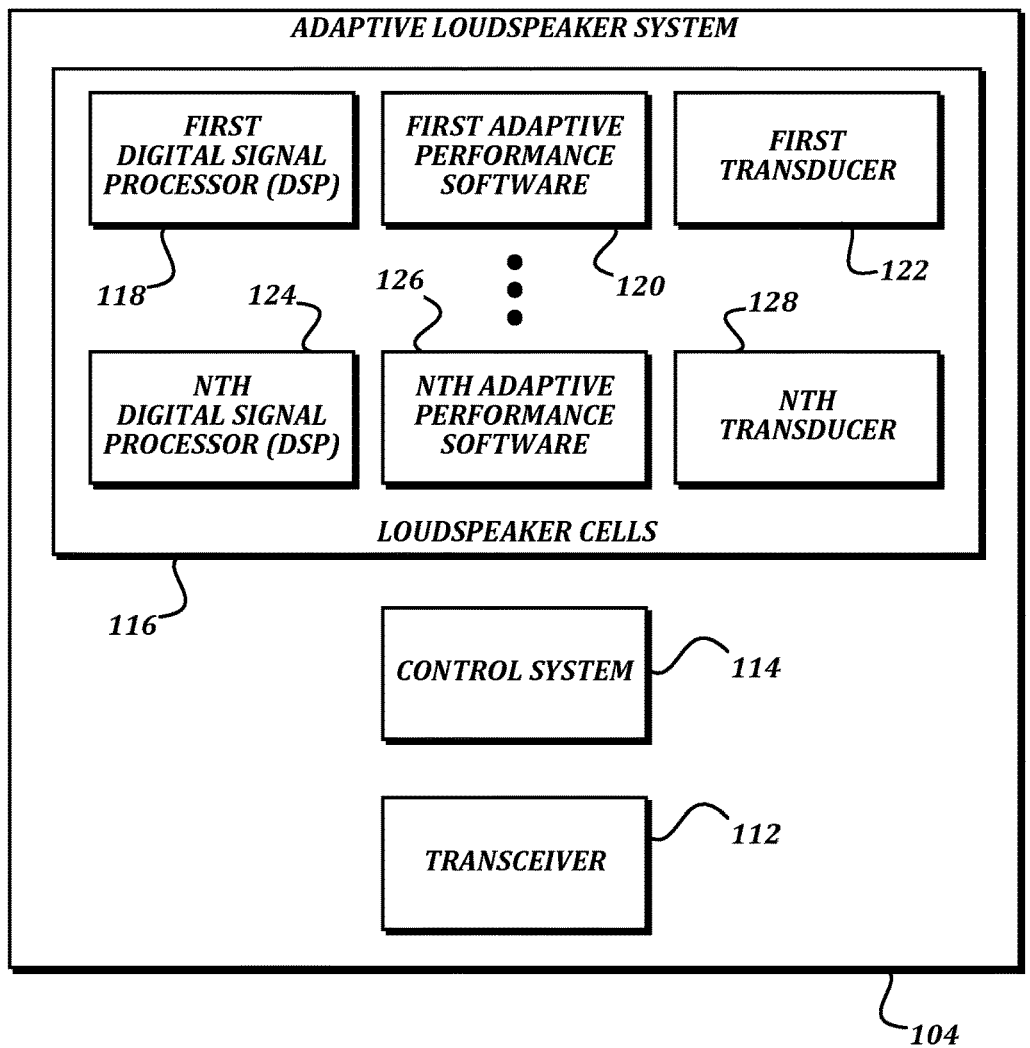
FIG. 1 is a block diagram that illustrates an example embodiment of an adaptive loudspeaker system and an adjustment computing device according to various aspects of the present disclosure.
Figure 1:
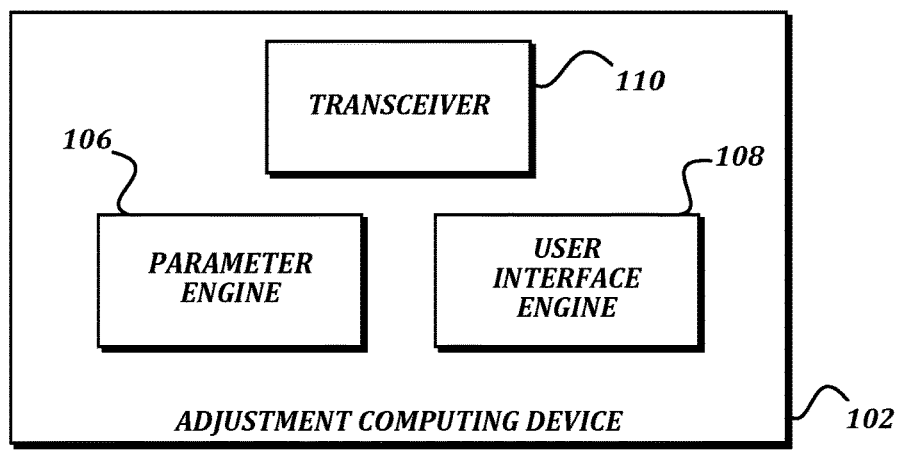

Sound systems for live concert touring are typically owned by a professional sound provider and travel in one of many tractor/trailer trucks with all of the band's production equipment. This can include lighting, video, staging and the band's instruments. A variety of speaker types is typically carried on the tour to accommodate the variety of seating arrangements various venues may provide.

Typically, a large line array is used to cover the main audience area and the farthest areas of an arena or stadium. Smaller line arrays are used to cover the outer sides and center of the audience area. Additional speakers are then also used on stage to cover the closest audience members. There may be from two to seven or more separate loudspeaker arrays brought in and flown (installed) on the day of the show. As most systems are symmetric on the left and right, one to four or more arrays must be designed to fit their respective coverage areas.

With existing line array loudspeakers, each box in the array can be physically arranged at a number of different angles relative to the adjacent box; smaller angles increase sound pressure level (SPL), larger angles increase vertical coverage. To get a general idea of the number of speakers required and location for array, acoustic modeling software is used to roughly "draw" the venue prior to the show. This initial look provides a starting point for future modeling, but not the actual angles or orientations of the speakers that need to be implemented on show day.

To fine-tune the speaker angles for the actual performance, a system engineer will arrive early in the morning at the venue to measure the dimensions of the room (typically with a laser range finder), and verify the actual suspension locations and trim height limitations. The venue configuration will then be modified in the modeling software and appropriate array angles and trim heights are chosen. This work must be completed before the loudspeakers can be flown (installed) in the venue.

The loudspeakers are then flown in the venue. Flying each array is a labor-intensive process. Large format loudspeakers typically weigh in excess of 200 lbs. Inter-cabinet angles must be set between each cabinet, typically at more than one point per cabinet. If angles are set incorrectly or the trim height is incorrect, the system could have non ideal coverage, or worse, not cover the entire audience. Once all the arrays are flown, connected and powered, the system technician will take acoustical measurements of the system to see how the performance matches their acoustic model. If performance is very poor and time permits, an array might be brought down and reconfigured. However, if time does not permit, typically only system equalization and array alignment delay can be adjusted to improve performance. In extreme cases at least some loudspeakers are unplugged to modify coverage.

Recently, advances have been made with regard to systems that include loudspeaker arrays that may be adjusted after being flown. For example, commonly owned, co-pending U.S. application Ser. No. 14/683,009, filed Apr. 9, 2015 (hereinafter "the Incorporated Disclosure"), discloses such an adaptive loudspeaker system, and is incorporated herein by reference in its entirety for all purposes. As noted in the incorporated disclosure, each of the high-frequency compression drivers as well as each of the mid-range cone transducers and each of the low-frequency cone transducers of a loudspeaker array system is individually powered as well as individually controlled. Associated with each high-frequency compression driver and each mid and low-frequency cone transducer is a digital signal processor (DSP) channel that operates in conjunction with adaptive performance software. This software assists in generating optimal DSP control parameters for the compression drivers and cone transducers by generating particular acoustic lobe configurations from the loudspeaker system as a whole.

Adaptive performance software, operating on a computing device, may be used to control the adaptive loudspeaker system. The software, by generating desired or optimal DSP control parameters for the compression drivers and cone transducers, is able to steer or direct the output from the compression drivers and cone transducers in the vertical and horizontal directions. Typically, the signal from the high-frequency compression drivers and mid and low-frequency cone transducers can be directed between any angle or angle range in the vertical direction from essentially straight down to straight up and anywhere therebetween.

One advantage of using such a system that includes a DSP channel for each compression driver and transducer is that separate settings can be applied for each compression driver and transducer. Embodiments of the present disclosure improve upon previous systems in several ways, including providing the ability to easily reconfigure the adaptive loudspeaker system after it has been installed in the venue. Further, embodiments of the present disclosure take advantage of the combination of being able to steer or direct output from the compression drivers and cone transducers, and being able to provide separate equalization settings for each compression driver and transducer, to allow different equalization targets to be configured in multiple different zones within a venue. In other words, a default set of equalization targets may be applied to the entire system, and then a first set of equalization targets may be applied to a first zone (such as a main floor) and a second set of equalization targets may be applied to a second zone (such as a balcony) in order to compensate for different room effects or other differences between the zones.

In some embodiments of the present disclosure, the adaptive performance software is improved in order to allow EQ control of zones within a venue using adaptive zone control. By allowing the user to indicate the area of the venue within the adaptive performance software that they wish to manipulate, the remainder of the system can then determine how to achieve the indicated targets. The settings for individual drivers and transducers can be computed by the adapted performance software in real time, and can be communicated to the control systems without having to bring down the loudspeaker system.

In some embodiments, adaptive zone control allows a user of the adaptive performance software to select an area of the venue, or "zone," and adjust tonal balance and level for that area. In some embodiments, once a zone is selected, the feature may look and feel similar to a traditional EQ interface that allows adjustment of output gains, notch filters, shelving, and parametric equalization, but the targets are then only applied for the selected zone.

In some embodiments, the adaptive performance software may receive a selection of an area within the venue. The adaptive performance software may then determine a smallest zone that includes the selected area, and may present the determined zone to the user to indicate what the affected area for the requested changes would be. In some embodiments, the adaptive performance software may take the shape of the venue, the capabilities of the loudspeaker array as configured and flown in the venue, and/or the specific setting changes which are desired in order to determine the smallest zone that includes the selected area.

FIG. 1 is a block diagram that illustrates an example embodiment of an adaptive loudspeaker system and an adjustment computing device according to various aspects of the present disclosure. In general, the adaptive loudspeaker system 104 is as described in the Incorporated Disclosure. Some components of the adaptive loudspeaker system 104 are illustrated and described herein to demonstrate how they may be controlled by the adjustment computing device 102. As illustrated, the adaptive loudspeaker system 104 includes a transceiver 112, a control system 114, and a plurality of loudspeaker cells 116.

The transceiver 112 is configured to enable communication between the adaptive loudspeaker system 104 and the adjustment computing device 102. This communication may use any suitable wired or wireless digital networking technology, including but not limited to USB, Ethernet, Firewire, Bluetooth, and Wi-Fi, and may use any suitable communication protocol, including but not limited to TCP/IP and Dante. In some embodiments, digital audio signals may be received by the transceiver 112 in addition to communication from the adjustment computing device 102. In some embodiments, digital audio signals may be received by a separate interface (not pictured). In some embodiments, the transceiver 112 may accept a removable computer-readable medium, such as a USB drive, an optical disk, or a floppy disk, that has been updated by the adjustment computing device 102.

The control system 114 is capable of controlling the gain, delay, and response of speaker systems in response to instructions provided by the adaptive performance software. The control system 114 includes components such as a delay subsystem for controlling the delay of the system, a parametric equalizer, a high pass filter, and a low pass filter to control the output produced by the system. The control system 114 may also include a subsystem to alter the gain and polarity of the output from the system.

Each loudspeaker cell includes various loudspeaker components. For example, a first loudspeaker cell includes a first digital signal processor (DSP) 118, a first adaptive performance software 120, and a first transducer 122. A plurality of loudspeaker cells may be present, up to an nth DSP 124, an nth adaptive performance software 126, and an nth transducer 128. The adaptive performance software assists in generating optimal DSP control parameters to help steer or direct the output of the adaptive loudspeaker system 104 in the vertical and horizontal directions under the direction of the control system 114.

In some embodiments, the adjustment computing device 102 provides an interface to a user for controlling the adaptive loudspeaker system 104. The adjustment computing device 102 may also calculate parameters for controlling the adaptive loudspeaker system 104, and may transmit the parameters that it calculates to the adaptive loudspeaker system 104 for implementation. Typically, the adjustment computing device 102 may be a laptop computing device or a desktop computing device. However, any other type of computing device capable of performing the described tasks of the adjustment computing device 102 may be used.

As illustrated, the adjustment computing device 102 includes a transceiver 110, a parameter engine 106, and a user interface engine 108. The transceiver 110 is a complementary unit to the transceiver 112 of the adaptive loudspeaker system 104, and so may also use any suitable wired or wireless digital networking technology that can communicate with that of the transceiver 112, including but not limited to USB, Ethernet, Firewire, Bluetooth, and Wi-Fi, and may likewise use any suitable communication protocol that can be used by the transceiver 112, including but not limited to TCP/IP and Dante. The parameter engine 106 is configured to generate acoustic parameters for transmission to the adaptive loudspeaker system 104, which are then used by the control system 114 to control the loudspeaker cells 116. The user interface engine 108 is configured to provide a user interface for configuring the adaptive loudspeaker system 104, including generating visualizations of predicted performance and receiving configuration changes. Further description of the actions performed by the parameter engine 106 and the user interface engine 108 is provided below.

In general, the word "engine," as used herein, refers to logic embodied in hardware or software instructions, which can be written in a programming language, such as C, C++, COBOL, JAVA™, PHP, Perl, HTML, CSS, JavaScript, VBScript, ASPX, Microsoft .NET™, and/or the like. An engine may be compiled into executable programs or written in interpreted programming languages. Software engines may be callable from other engines or from themselves. Generally, the engines described herein refer to logical modules that can be merged with other engines, or can be divided into sub-engines. The engines can be stored in any type of computer-readable medium or computer storage device and be stored on and executed by one or more general purpose computers, thus creating a special purpose computer configured to provide the engine.

Figure 2A:
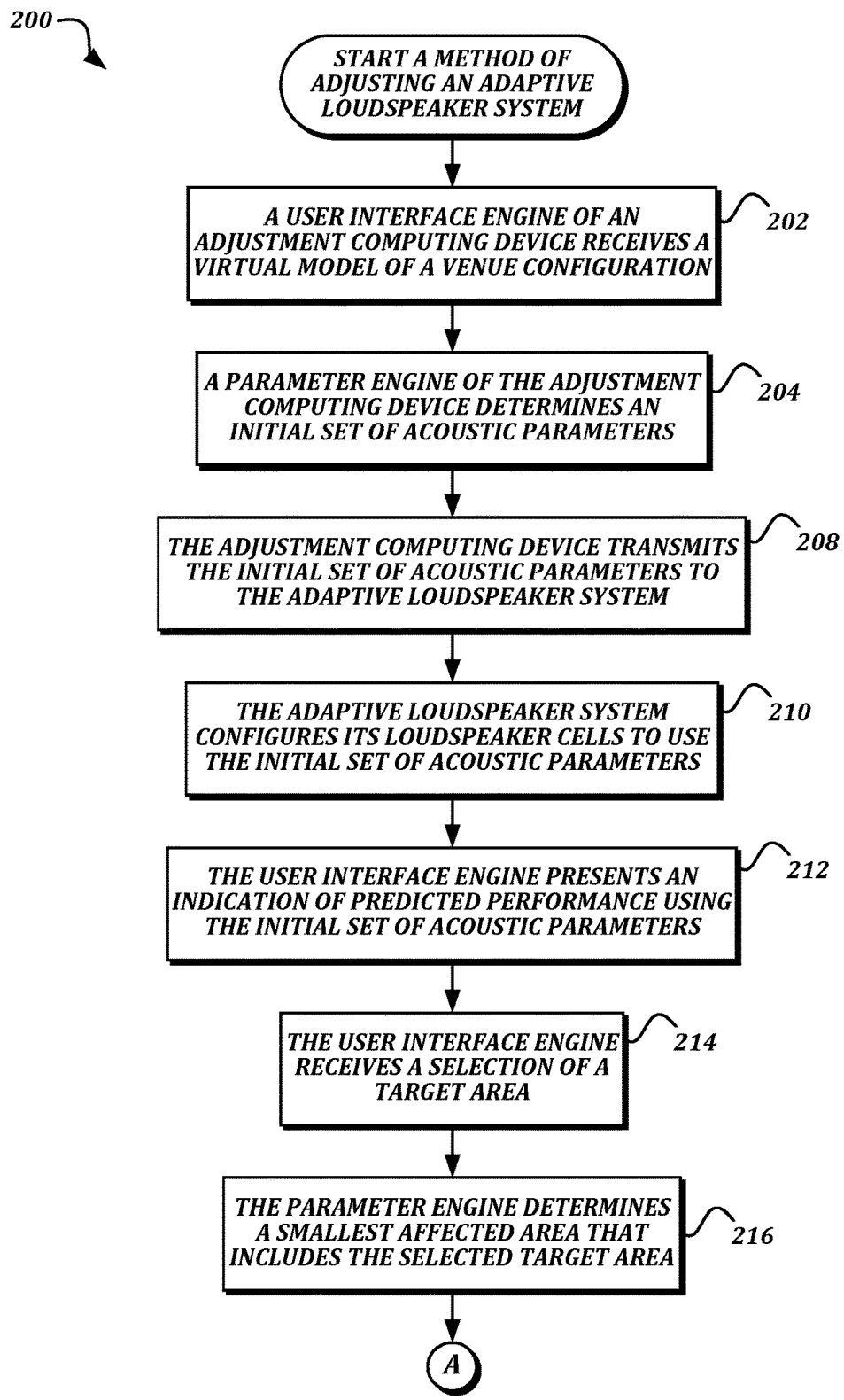
FIGS. 2A-2B are a flowchart that illustrates an example embodiment of a method of adjusting an adaptive loudspeaker system according to various aspects of the present disclosure.
Figure 2B:
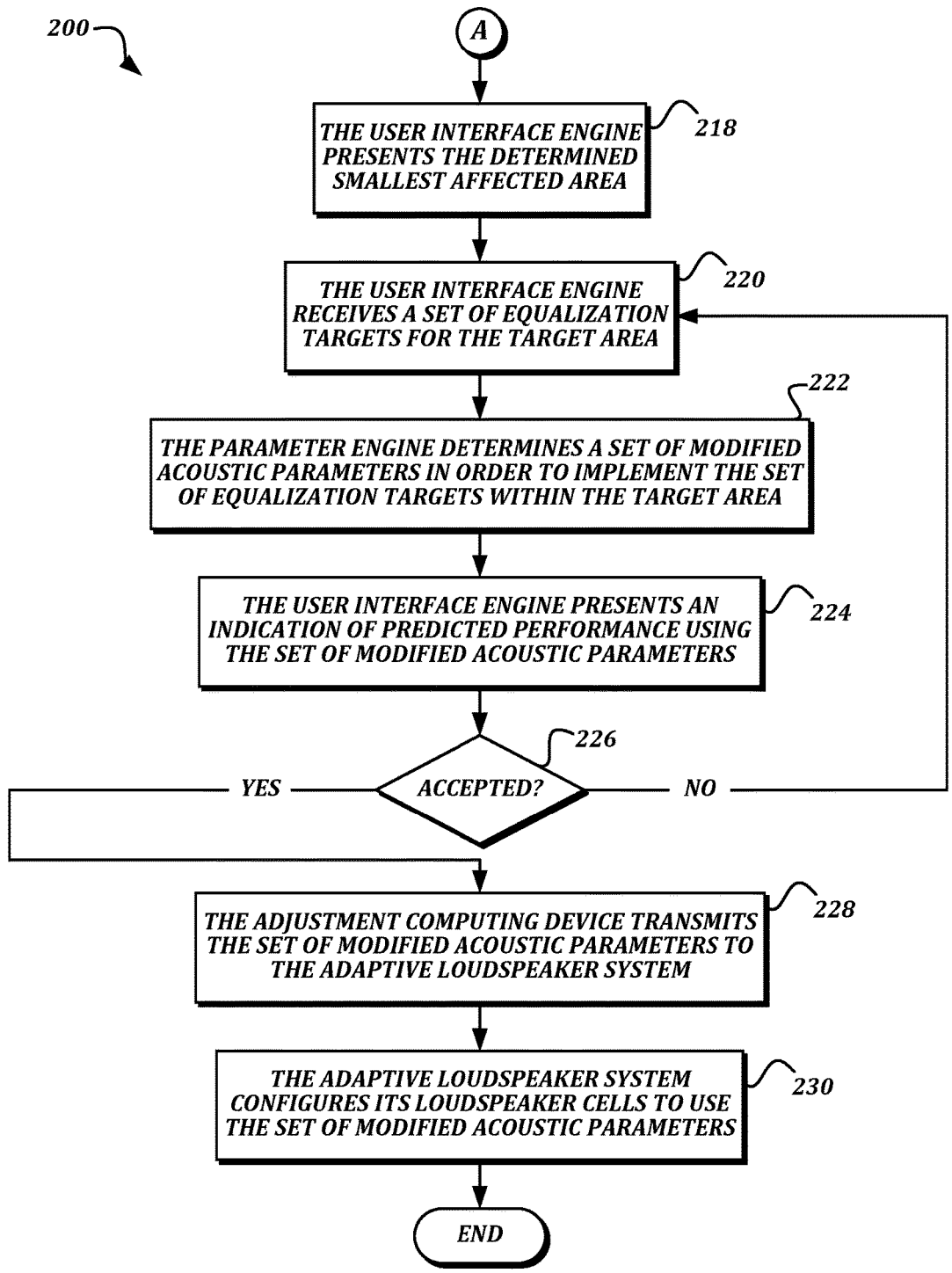

FIGS. 2A-2B are a flowchart that illustrates an example embodiment of a method of adjusting an adaptive loudspeaker system according to various aspects of the present disclosure. From a start block, the method 200 proceeds to block 202, where a user interface engine 108 of an adjustment computing device 102 receives a virtual model of a venue configuration. The virtual model of a venue configuration may include a location and physical configuration of the adaptive loudspeaker system 104, locations of one or more audience surfaces, and locations of one or more non-audience surfaces. In some embodiments, the virtual model may also include measurements of humidity, temperature, and/or other factors that influence air absorption characteristics and/or air loss compensation processing. In some embodiments, the virtual model may be loaded from a computer-readable medium, may be entered by a user into a user interface, may be measured using a laser range finding system, or may be obtained by any other suitable technique.

At block 204, a parameter engine 106 of the adjustment computing device 102 determines an initial set of acoustic parameters. The initial set of acoustic parameters include parameters that control factors such as voicing, directivity, equalization, coverage, and coverage limits of the adaptive loudspeaker system 104. The initial set of acoustic parameters includes a separate set of parameters for each of the loudspeaker cells 116. Detailed discussion of the calculation of acoustic parameters is provided in the Incorporated Disclosure, and so is not repeated here for the sake of brevity.

The method 200 then proceeds to block 208, where the adjustment computing device 102 transmits the initial set of acoustic parameters to the adaptive loudspeaker system 104. This transmission uses the transceiver 110 and the transceiver 112. At block 210, the adaptive loudspeaker system 104 configures its loudspeaker cells 116 to use the initial set of acoustic parameters. This configuration task may include the control system 114 providing relevant acoustic parameters to the appropriate DSPs 118, 124 or adaptive performance software 120, 126 of the loudspeaker cells 116.

At block 212, the user interface engine 108 presents an indication of predicted performance using the initial set of acoustic parameters. In some embodiments, the indication of predicted performance may be a two-dimensional or a three-dimensional depiction of the venue with contour lines, shading, or coloring representing predicted sound pressure levels (SPL) within the venue. In some embodiments, the accuracy of the indication of predicted performance may be enhanced by sampling done by a sampling device such as a microphone, though in some embodiments, no sampling is performed. The user may use the presented indication to find weaknesses in the current configuration of the adaptive loudspeaker system 104.

Once the user has identified an area in which performance may be improved, the method 200 proceeds to block 214, where the user interface engine 108 receives a selection of a target area. The target area is an area within the venue in which the user wants to change the performance of the adaptive loudspeaker system 104. In some embodiments, the selection of a target area may be specified by the user providing a start location and an end location, which are typically specified as horizontal distances from the adaptive loudspeaker system 104. The selection may be provided by inputting a numerical value, by clicking a displayed portion of the venue model, or by any other suitable technique. In some embodiments, the selection of a target area may also include a vertical cutoff or override value, such that adjustment may be made only to an area above or below a given height from the floor of the venue. The vertical cutoff or override value may be useful in situations where a given change is intended to be applied only to a main floor of the venue while excluding a balcony of the venue, or vice versa.

At block 216, the parameter engine 106 determines a smallest affected area that includes the selected target area. The smallest affected area may be based on the number of loudspeaker cells 116 and their arrangement with respect to the venue. For example, if there are a larger number of loudspeaker cells 116, then a smaller affected area may be achievable than if there is a smaller number of loudspeaker cells 116, and therefore the smallest affected area may more closely match the target area.

The method 200 then proceeds to a continuation terminal ("terminal A"). From terminal A (FIG. 2B), the method 200 proceeds to block 218, where the user interface engine 108 presents the determined smallest affected area. In some embodiments, the target area may be indicated on a depiction of the venue with a first type of lines (such as solid lines), and the smallest affected area may be indicated with a second type of lines (such as dashed lines). At this point, the user may change the definition of the target area if the smallest affected area is not desirable.

At block 220, the user interface engine 108 receives a set of equalization targets for the target area. The set of equalization targets may include equalization settings such as amplitude, center frequency, and Q factor. Next, at block 222, the parameter engine 106 determines a set of modified acoustic parameters in order to implement the set of equalization targets within the target area, and at block 224, the user interface engine 108 presents an indication of predicted performance using the set of modified acoustic parameters. As described above, the initial set of acoustic parameters included parameters that control factors such as voicing, directivity, equalization, coverage, and coverage limits. Further, the initial set of acoustic parameters included parameters for each of the loudspeaker cells 116. In contrast, the set of modified acoustic parameters may just include parameters relevant to equalization, which are a subset of the initial set of acoustic parameters, and may just include parameters for loudspeaker cells 116 that are intended to service the smallest affected area (instead of all of the loudspeaker cells 116). The adaptive loudspeaker system 104 may continue to use the initial set of parameters, as they are updated by the set of modified acoustic parameters. Because the set of modified acoustic parameters are a subset of the initial set of acoustic parameters, the set of modified acoustic parameters can be calculated much more quickly, and so can be adjusted in real time.

The method 200 then proceeds to a decision block 226, where a decision is made based on whether the performance of the set of modified acoustic parameters is accepted by the user. If the user reviews the predicted performance and finds that further adjustments should be made, then the decision at decision block 226 is NO, and the method 200 returns to block 220 so that the user may provide a new set of equalization targets. Otherwise, if the user finds the predicted performance to be acceptable, then the decision at decision block 226 is YES, and the method 200 proceeds to block 228.

At block 228, the adjustment computing device 102 transmits the set of modified acoustic parameters to the adaptive loudspeaker system 104. This transmission is performed in a manner similar to how the initial set of acoustic parameters was transmitted to the adaptive loudspeaker system 104. At block 230, the adaptive loudspeaker system 104 configures its loudspeaker cells to use the set of modified acoustic parameters. In some embodiments, the control system 114 may replace some of the initial set of acoustic parameters with the updated parameters in the set of modified acoustic parameters, and may leave the remainder of the initial set of acoustic parameters unmodified. The method 200 then proceeds to an end block and terminates.

One of ordinary skill in the art will recognize that some of the steps of the method 200 may be repeated or reordered without departing from the scope of the present disclosure. For example, in some embodiments, an indication of a predicted performance of the initial set of acoustic parameters may be generated and presented by the adjustment computing device 102 before transmitting the initial set of acoustic parameters to the adaptive loudspeaker system 104. As another example, in some embodiments, the set of modified acoustic parameters may be transmitted to the adaptive loudspeaker system 104 before the indication of predicted performance of the set of modified acoustic parameters is presented.

Figure 3A:
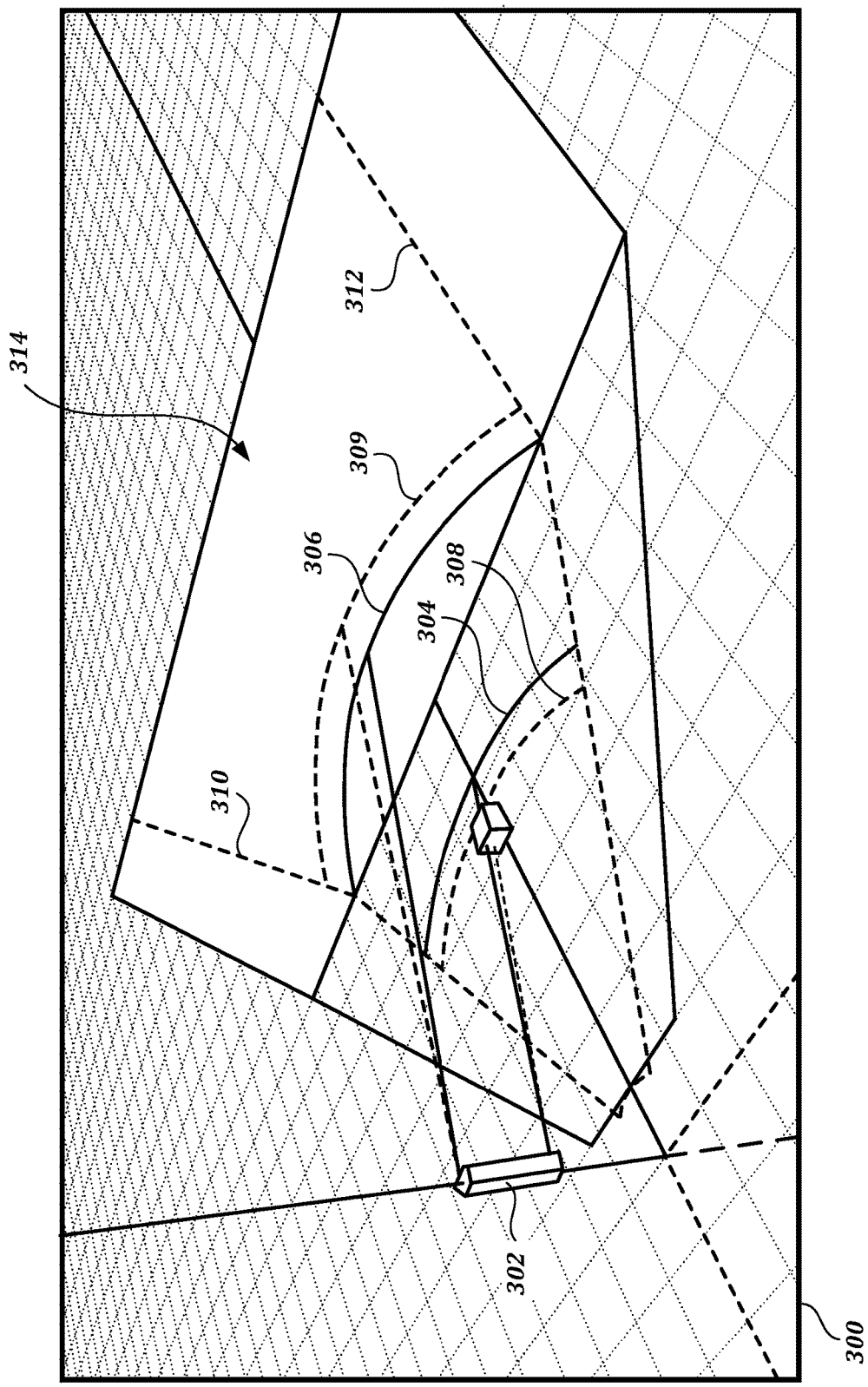
FIG. 3A is an illustration of an example interface that shows a parametric view of a venue with a flat main floor in front of an inclined seating area according to various aspects of the present disclosure.
Figure 3B:
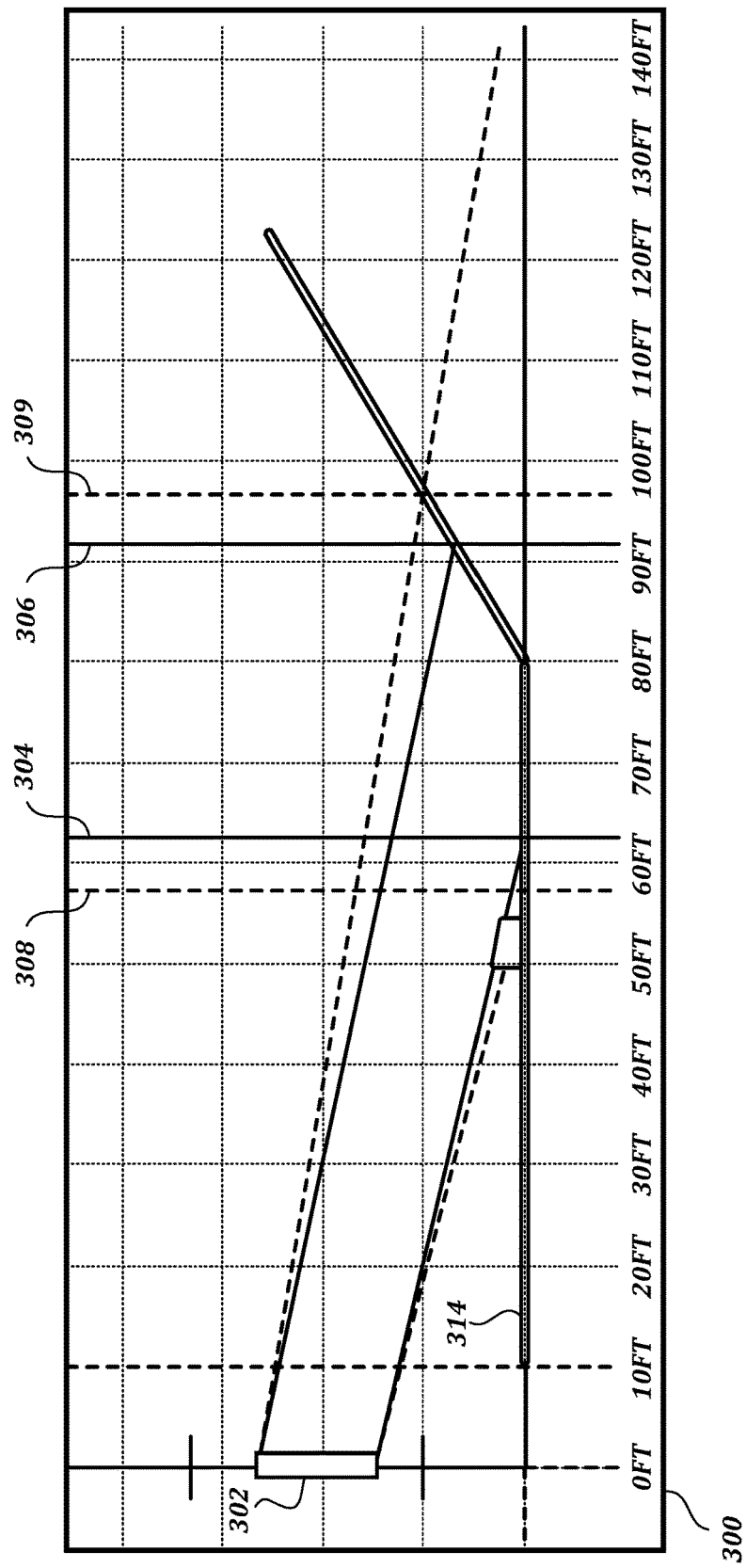
FIG. 3B illustrates the example interface presenting a side view of the same venue presented in FIG. 3A.

An example interface 300 that shows a parametric view of a venue with a flat main floor in front of an inclined seating area is shown in FIG. 3A. This is an example of an interface 300 such as one presented in block 218 of the method 200 described above, in that it includes both an indication of a target area and an indication of a smallest affected area. In the interface 300, the shaded gray area 314 includes two surfaces that represent the audience area. The dotted lines 310, 312 extending radially away from the loudspeaker system 302 indicate the area served by the adaptive loudspeaker system 302. The solid arcuate lines indicate an start location 304 and an end location 306 specified by the user as distances from the adaptive loudspeaker system 302. The dashed arcuate line 308 closer to the adaptive loudspeaker system 302 indicates the X_start border of the determined smallest zone that includes the start location 304 selected by the user. The dashed arcuate line 309 further from the adaptive loudspeaker system 302 indicates the X_end border of the determined smallest zone that includes the end location 306 selected by the user. FIG. 3B illustrates the interface 300 presenting a side view of the same venue presented in FIG. 3A. In some embodiments, multiple zones may be selected and/or configured separately. In such embodiments, the multiple zones may be indicated using different colors within the interface.

Figure 4:
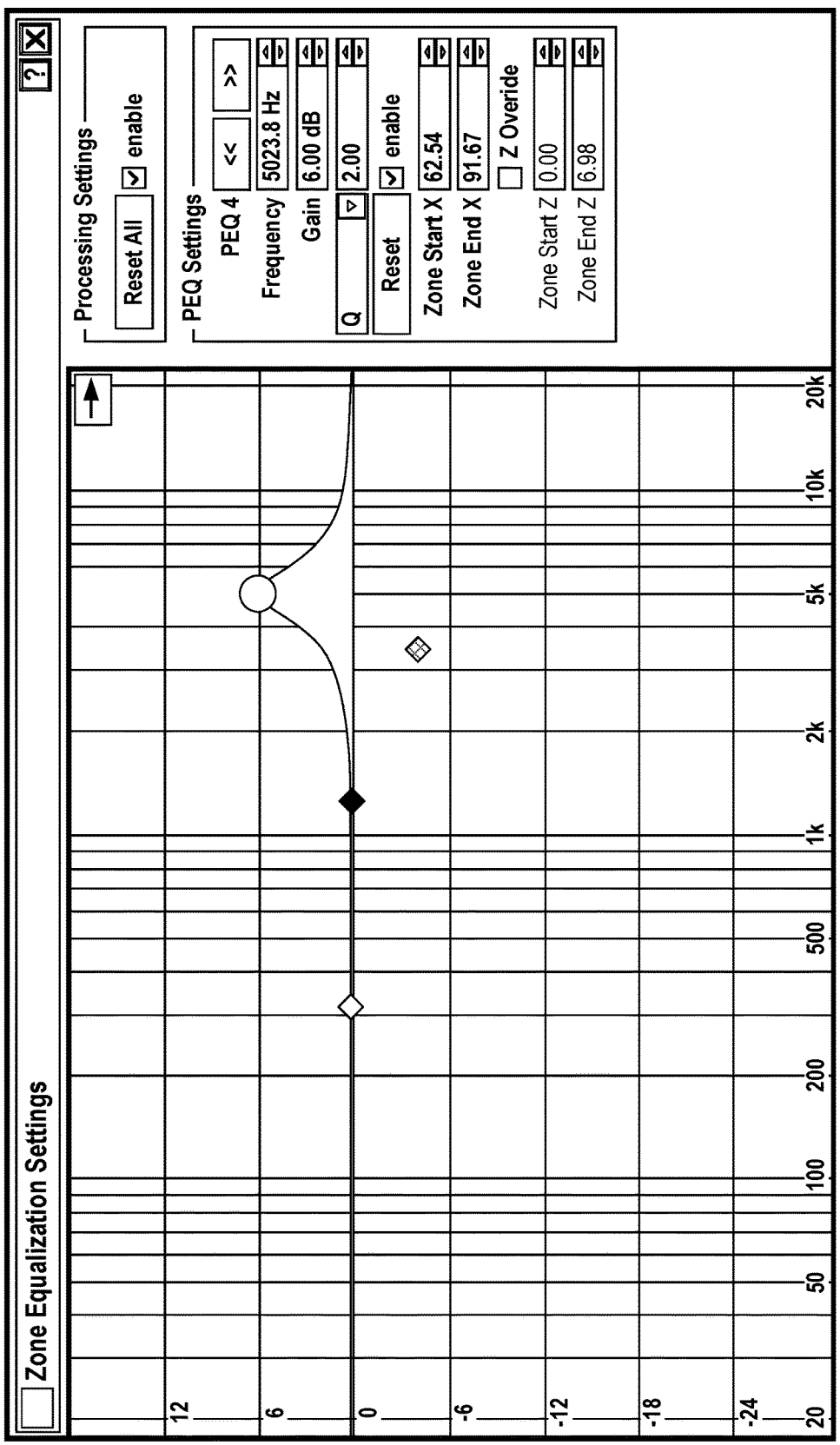
FIG. 4 illustrates an example interface for adjusting equalization targets for the smallest affected zone.

One example interface for adjusting equalization targets for the smallest affected zone is illustrated in FIG. 4. As shown, the interface allows for the specification of a center frequency and a Q factor, as well as a parametric equalization graph for adjusting amplitude. The interface also allows adjustment to the start location, the end location, and the vertical override value for the zone.

Figure 5:
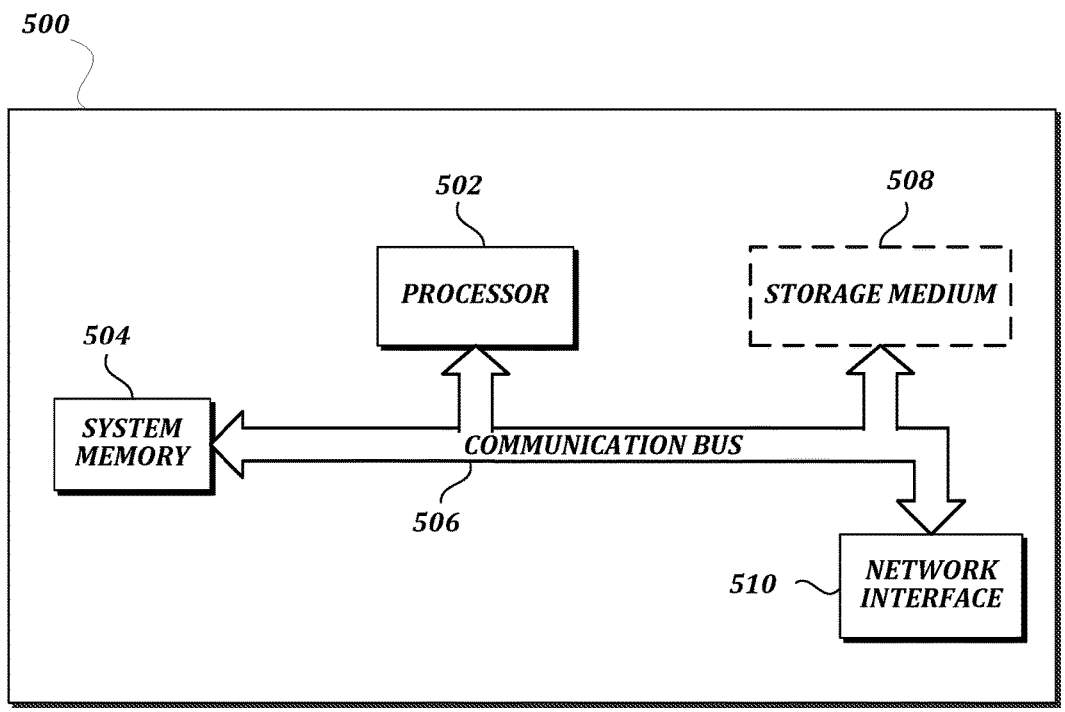
FIG. 5 is a block diagram that illustrates aspects of an exemplary computing device appropriate for use with embodiments of the present disclosure.

FIG. 5 is a block diagram that illustrates aspects of an exemplary computing device 500 appropriate for use with embodiments of the present disclosure. While FIG. 5 is described with reference to a computing device that is implemented as a device on a network, the description below is applicable to servers, personal computers, mobile phones, smart phones, tablet computers, embedded computing devices, and other devices that may be used to implement portions of embodiments of the present disclosure. Moreover, those of ordinary skill in the art and others will recognize that the computing device 500 may be any one of any number of currently available or yet to be developed devices.

In its most basic configuration, the computing device 500 includes at least one processor 502 and a system memory 504 connected by a communication bus 506. Depending on the exact configuration and type of device, the system memory 504 may be volatile or nonvolatile memory, such as read only memory ("ROM"), random access memory ("RAM"), EEPROM, flash memory, or similar memory technology. Those of ordinary skill in the art and others will recognize that system memory 504 typically stores data and/or program modules that are immediately accessible to and/or currently being operated on by the processor 502. In this regard, the processor 502 may serve as a computational center of the computing device 500 by supporting the execution of instructions.

As further illustrated in FIG. 5, the computing device 500 may include a network interface 510 comprising one or more components for communicating with other devices over a network. Embodiments of the present disclosure may access basic services that utilize the network interface 510 to perform communications using common network protocols. The network interface 510 may also include a wireless network interface configured to communicate via one or more wireless communication protocols, such as Wi-Fi, 2G, 3G, LTE, WiMAX, Bluetooth, and/or the like.

In the exemplary embodiment depicted in FIG. 5, the computing device 500 also includes a storage medium 508. However, services may be accessed using a computing device that does not include means for persisting data to a local storage medium. Therefore, the storage medium 508 depicted in FIG. 5 is represented with a dashed line to indicate that the storage medium 508 is optional. In any event, the storage medium 508 may be volatile or nonvolatile, removable or nonremovable, implemented using any technology capable of storing information such as, but not limited to, a hard drive, solid state drive, CD ROM, DVD, or other disk storage, magnetic cassettes, magnetic tape, magnetic disk storage, and/or the like.

As used herein, the term "computer-readable medium" includes volatile and non-volatile and removable and non-removable media implemented in any method or technology capable of storing information, such as computer readable instructions, data structures, program modules, or other data. In this regard, the system memory 504 and storage medium 508 depicted in FIG. 5 are merely examples of computer-readable media.

Suitable implementations of computing devices that include a processor 502, system memory 504, communication bus 506, storage medium 508, and network interface 510 are known and commercially available. For ease of illustration and because it is not important for an understanding of the claimed subject matter, FIG. 5 does not show some of the typical components of many computing devices. In this regard, the computing device 500 may include input devices, such as a keyboard, keypad, mouse, microphone, touch input device, touch screen, tablet, and/or the like. Such input devices may be coupled to the computing device 500 by wired or wireless connections including RF, infrared, serial, parallel, Bluetooth, USB, or other suitable connections protocols using wireless or physical connections. Similarly, the computing device 500 may also include output devices such as a display, speakers, printer, etc. Since these devices are well known in the art, they are not illustrated or described further herein.

While illustrative embodiments have been illustrated and described, it will be appreciated that various changes can be made therein without departing from the spirit and scope of the invention.

The embodiments of the invention in which an exclusive property or privilege is claimed are defined as follows:

1. An adaptive loudspeaker system, comprising:
    (a) a plurality of adaptive loudspeakers, each loudspeaker comprising:
        (i) a housing;
        (ii) a plurality of transducers within the housing, said transducers being powered and controlled independently of each other; and
        (iii) a digital signal processor channel for each transducer to control the vertical and/or horizontal directionality of the loudspeaker system output;
    (b) an electronic network interconnecting the digital signal processing channels with each other;
    (c) a control system monitoring and controlling the operation and performance of the transducers individually, said control system comprising a computer processor connected to said electronic network and capable of receiving acoustic parameters, said control system controlling the operation of the transducers based in part on the received acoustic parameters; and
    (d) a computing device configured to provide adaptive performance software, wherein the adaptive performance software is configured to:
        (i) calculate an initial set of acoustic parameters for a venue;
        (ii) transmit the initial set of acoustic parameters to the control system;
        (iii) receive a selection of an area of the venue;
        (iv) determine a smallest affected zone that includes the selected area;
        (v) receive a set of equalization targets;
        (vi) determine a set of modified acoustic parameters in order to implement the set of equalization targets within the smallest affected zone; and
        (vii) transmit the set of modified acoustic parameters to the control system.

2. The system of claim 1, wherein the set of equalization targets include at least one of an amplitude, a center frequency, and a Q factor.

3. The system of claim 1, wherein the set of modified acoustic parameters affect control of fewer than all of the transducers of the set of transducers.

4. The system of claim 1, wherein the set of modified acoustic parameters are a subset of the initial set of acoustic parameters.

5. The system of claim 4, wherein the initial set of acoustic parameters affect voicing, directivity, and equalization of the output of the adaptive loudspeaker system, and wherein the set of modified acoustic parameters affect equalization only.

6. The system of claim 1, wherein the smallest affected zone is determined based on a number and position of the plurality of transducers.

7. The system of claim 1, wherein the adaptive performance software is further configured to:
    determine an effect of the set of modified acoustic parameters; and
    display the effect of the set of modified acoustic parameters before transmitting the set of modified acoustic parameters to the control system.

8. The system of claim 1, wherein the selection of the area of the venue includes a start distance and an end distance.

9. The system of claim 8, wherein the selection of the area of the venue includes a vertical override value.

10. A method of adjusting an adaptive loudspeaker system in a venue, the method comprising:

calculating, by a computing device, an initial set of acoustic parameters;

transmitting, by the computing device, the initial set of acoustic parameters to a control system of the adaptive loudspeaker system;

receiving, by the computing device, a selection of an area of the venue;

determining, by the computing device, a smallest affected zone that includes the selected area;

receiving, by the computing device, a set of equalization targets;

determining, by the computing device, a set of modified acoustic parameters in order to implement the set of equalization targets within the smallest affected zone; and transmitting, by the computing device, the set of modified acoustic parameters to the control system of the adaptive loudspeaker system to implement the equalization targets in the smallest affected zone.

11. The method of claim 10, wherein the set of equalization targets includes at least one of an amplitude, a center frequency, and a Q factor.

12. The method of claim 10, wherein the adaptive loudspeaker system includes a plurality of transducers, and wherein the set of modified acoustic parameters affect control of fewer than all of the transducers of the plurality of transducers.

13. The method of claim 10, wherein the set of modified acoustic parameters are a subset of the initial set of acoustic parameters.

14. The method of claim 13, wherein the initial set of acoustic parameters affect voicing, directivity, and equalization of the output of the adaptive loudspeaker system, and wherein the set of modified acoustic parameters affect equalization only.

15. The method of claim 10, wherein the smallest affected zone is determined based on a number and position of a plurality of transducers of the adaptive loudspeaker system.

16. The method of claim 10, further comprising:
determining an effect of the set of modified acoustic parameters; and
presenting the effect of the set of modified acoustic parameters before transmitting the set of modified acoustic parameters to the control system.

17. The method of claim 10, wherein the selection of the area includes a start distance and an end distance.

18. The method of claim 17, wherein the selection of the area includes a vertical override value.

19. A non-transitory computer-readable medium having computer-executable instructions stored thereon that, in response to execution by one or more processors of a computing device, cause the computing device to adjust an adaptive loudspeaker system in a venue by:
calculating an initial set of acoustic parameters;
transmitting the initial set of acoustic parameters to a control system of the adaptive loudspeaker system;
receiving a selection of an area of the venue;
determining a smallest affected zone that includes the selected area;
receiving a set of equalization targets;
determining a set of modified acoustic parameters in order to implement the set of equalization targets within the smallest affected zone; and
transmitting the set of modified acoustic parameters to the control system to implement the equalization targets in the smallest affected zone.

20. The computer-readable medium of claim 19, wherein the set of modified acoustic parameters are a subset of the initial set of acoustic parameters;
wherein the initial set of acoustic parameters affect voicing, directivity, and equalization of the output of the adaptive loudspeaker system; and
wherein the set of modified acoustic parameters affect equalization only.

* * * * *